US012615868B2

(12) United States Patent
Park

(10) Patent No.: US 12,615,868 B2
(45) Date of Patent: Apr. 28, 2026

(54) ELECTRONIC DEVICE INCLUDING A FINGERPRINT RECOGNITION FUNCTION

(71) Applicant: Samsung Display Co., Ltd., Yongin-Si (KR)

(72) Inventor: Youngok Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 531 days.

(21) Appl. No.: 18/100,742

(22) Filed: Jan. 24, 2023

(65) Prior Publication Data

US 2023/0361141 A1 Nov. 9, 2023

(30) Foreign Application Priority Data

Apr. 5, 2022 (KR) ........................ 10-2022-0042001

(51) Int. Cl.
*H10F 39/00* (2025.01)
*G06V 40/13* (2022.01)
(Continued)

(52) U.S. Cl.
CPC ..... *H10F 39/8063* (2025.01); *G06V 40/1318* (2022.01); *H10F 39/8057* (2025.01); *H10K 59/90* (2023.02); *H10K 59/122* (2023.02)

(58) Field of Classification Search
CPC ............. H10F 39/8063; H10F 39/8057; H10F 39/198; G06V 40/1318; H10K 59/90; H10K 59/122; H10K 59/1213; H10K 59/65; H10K 59/879; H10K 59/8792; H10K 59/60; H10K 50/85; H10K 50/86; H10K 59/40; H04M 2203/6054

See application file for complete search history.

(56) References Cited

U.S. PATENT DOCUMENTS

| 6,407,516 B1 | 6/2002 | Victor |
| 10,410,033 B2 | 9/2019 | He et al. |

(Continued)

FOREIGN PATENT DOCUMENTS

| JP | 2014-063171 A2 | 4/2014 |
| KR | 10-0878966 | 1/2009 |

(Continued)

OTHER PUBLICATIONS

M. Deguchi, et al., "Microlens Design Using Simulation Program for CCD Image Sensor", IEEE Transactions on Consumer Electronics, 38, pp. 583-589, 1992.

(Continued)

*Primary Examiner* — Jonathan Han
(74) *Attorney, Agent, or Firm* — F. CHAU & ASSOCIATES, LLC

(57) ABSTRACT

Provided is an electronic device including: a biometric information sensing layer including a sensor; an optical pattern layer disposed on the biometric information sensing layer, and including a plurality of transmission parts and a light shielding part; and a display layer disposed on the optical pattern layer. When a fill factor (FF) of the sensor, which is a ratio of the amount of light received by the sensor to the total amount of light incident onto the sensor, is about 10% to about 70%, a field of view (FOV) of light incident onto the sensor is about 15° to about 30°.

17 Claims, 10 Drawing Sheets

(51) Int. Cl.
  H10K 59/122       (2023.01)
  H10K 59/90        (2023.01)

(56)            References Cited

U.S. PATENT DOCUMENTS

| | | | |
|---|---|---|---|
| 11,182,584 B2 | 11/2021 | Lee et al. | |
| 11,937,450 B2 | 3/2024 | Sugitani et al. | |
| 2019/0026527 A1* | 1/2019 | He ...................... | G02B 6/0026 |
| 2020/0195824 A1 | 6/2020 | Koo et al. | |
| 2021/0019017 A1* | 1/2021 | Yeke Yazdandoost ...................... | |
| | | | H10K 50/30 |
| 2023/0306778 A1* | 9/2023 | Hsu ...................... | G02B 3/0075 |

FOREIGN PATENT DOCUMENTS

| | | |
|---|---|---|
| KR | 10-2020-0010700 A | 1/2020 |
| KR | 10-2198341 | 1/2021 |
| KR | 10-2021-0037057 A | 4/2021 |
| KR | 10-2021-0041012 | 4/2021 |
| WO | 2017211152 | 12/2017 |

OTHER PUBLICATIONS

W. Wen, et al., (2015) "Novel Software-Based Method to Widen Dynamic Range of CCD Sensor Images", In: Zhang YJ. (eds) Image and Graphics, ICIG 2015, Lecture Notes in Computer Science, vol. 9218, Springer, Cham, 13 pages.

H. Akkerman, et al., "Large-area Optical fingerprint Sensors for next generation smartphones", SID 2019, pp. 1000-1003.

* cited by examiner

ELECTRONIC DEVICE INCLUDING A FINGERPRINT RECOGNITION FUNCTION

CROSS-REFERENCE TO RELATED APPLICATION

This U.S. non-provisional patent application claims priority under 35 U.S.C. § 119 to Korean Patent Application No. 10-2022-0042001, filed on Apr. 5, 2022, the disclosure of which is incorporated by reference herein in its entirety.

TECHNICAL FIELD

The present inventive concept relates to an electronic device including a fingerprint recognition function.

DISCUSSION OF THE RELATED ART

Electronic devices provide various functions that enable communication with a user. For example, electronic devices may include a function of providing information to the user by displaying an image or sensing a user's input. Recent electronic devices also include a function for sensing a user's fingerprint. Fingerprint recognition may be performed with, for example, a capacitive method for sensing a capacitance change formed between electrodes, an optical method for sensing incident light using an optical sensor, or an ultrasonic method for sensing a vibration using a piezoelectric body. In recent electronic devices, a sensing unit for fingerprint recognition may be disposed on a display layer.

SUMMARY

According to an embodiment of the present inventive concept, an electronic device includes: a biometric information sensing layer including a sensor; an optical pattern layer disposed on the biometric information sensing layer, and including a plurality of transmission parts and a light shielding part; and a display layer disposed on the optical pattern layer, wherein when a fill factor (FF) of the sensor, which is a ratio of the amount of light received by the sensor to the total amount of light incident onto the sensor, is about 10% to about 70%, a field of view (FOV) of light incident onto the sensor is about 15° to about 30°.

In an embodiment of the present inventive concept, when the fill factor of the sensor unit is about 10% to about 70%, a proportion of a cross-talk component of the sensor may be about 1% to about 10%.

In an embodiment of the present inventive concept, when the fill factor of the sensor is greater than about 70% and equal to or less than about 100%, the field of view may be about 1° to about 7°.

In an embodiment of the present inventive concept, when the fill factor of the sensor is greater than about 70% and equal to or less than about 100%, a proportion of a cross-talk component of the sensor may be about 1% to about 5%.

In an embodiment of the present inventive concept, the electronic device may further include a light collecting layer disposed between the display layer and the optical pattern layer.

In an embodiment of the present inventive concept, the light collecting layer may include a refractive layer and a cover layer disposed on the refractive layer.

In an embodiment of the present inventive concept, a first refractive index of the refractive layer may be greater than a second refractive index of the cover layer.

In an embodiment of the present inventive concept, the refractive layer may include a lens array, and the cover layer may include an infrared filter.

In an embodiment of the present inventive concept, the plurality of transmission parts may be arranged along a first direction and a second direction crossing the first direction, and the light shielding part may surround the plurality of transmission parts.

In an embodiment of the present inventive concept, the display layer may include: a base layer; a circuit layer disposed on the base layer, and including a pixel circuit; and a light-emitting element layer disposed on the circuit layer, and including a first electrode, a light-emitting layer, and a second electrode, wherein the first electrode and the second electrode may each include a transparent conductive material.

In an embodiment of the present inventive concept, the display layer may include an active region and a peripheral region adjacent to the active region, wherein the active region displays an image, wherein the biometric information sensing layer may include a sensing region sensing biometric information, and wherein the sensing region may overlap the active region.

In an embodiment of the present inventive concept, at least one side of the sensor has a length of about 40 μm to about 60 μm.

According to an embodiment of the present inventive concept, an electronic device may include: a biometric information sensing layer including a sensor; an optical pattern layer disposed on the biometric information sensing layer, and including a plurality of transmission parts and a light shielding part; a refractive layer disposed on the optical pattern layer, and including a lens array; and a display layer disposed on the refractive layer, wherein when a fill factor (FF) of the sensor, which is a ratio of the amount of light received by the sensor to the total amount of light incident onto the sensor, is greater than about 70% and equal to or less than 100%, a field of view (FOV) of light incident onto the sensor is about 1° to about 7°.

In an embodiment of the present inventive concept, when the fill factor of the sensor is greater than about 70% and equal to or less than 100%, a proportion of a cross-talk component of the sensor may be about 1% to about 5%.

In an embodiment of the present inventive concept, when the fill factor of the sensor is about 10% to about 70%, the field of view may be about 15° to about 30°.

In an embodiment of the present inventive concept, the fill factor of the sensor is about 10% to about 70%, a proportion of a cross-talk component of the sensor may be about 1% to about 10%.

In an embodiment of the present inventive concept, the electronic device may further include a cover layer disposed between the display layer and the refractive layer.

In an embodiment of the present inventive concept, the cover layer may include an infrared filter.

In an embodiment of the present inventive concept, the display layer may include an active region and a peripheral region adjacent to the active region, wherein the active region displays an image, wherein the biometric information sensing layer may include a sensing region sensing biometric information, and wherein the sensing region may overlap the active region.

In an embodiment of the present inventive concept, the sensor may have an area of about 40 μm×about 40 μm to about 60 μm×about 60 μm.

BRIEF DESCRIPTION OF THE FIGURES

The above and other features of the present inventive concept will become more apparent by describing in detail embodiments thereof with reference to the accompanying drawings, in which.

DETAILED DESCRIPTION OF THE EMBODIMENTS

Figure 1:
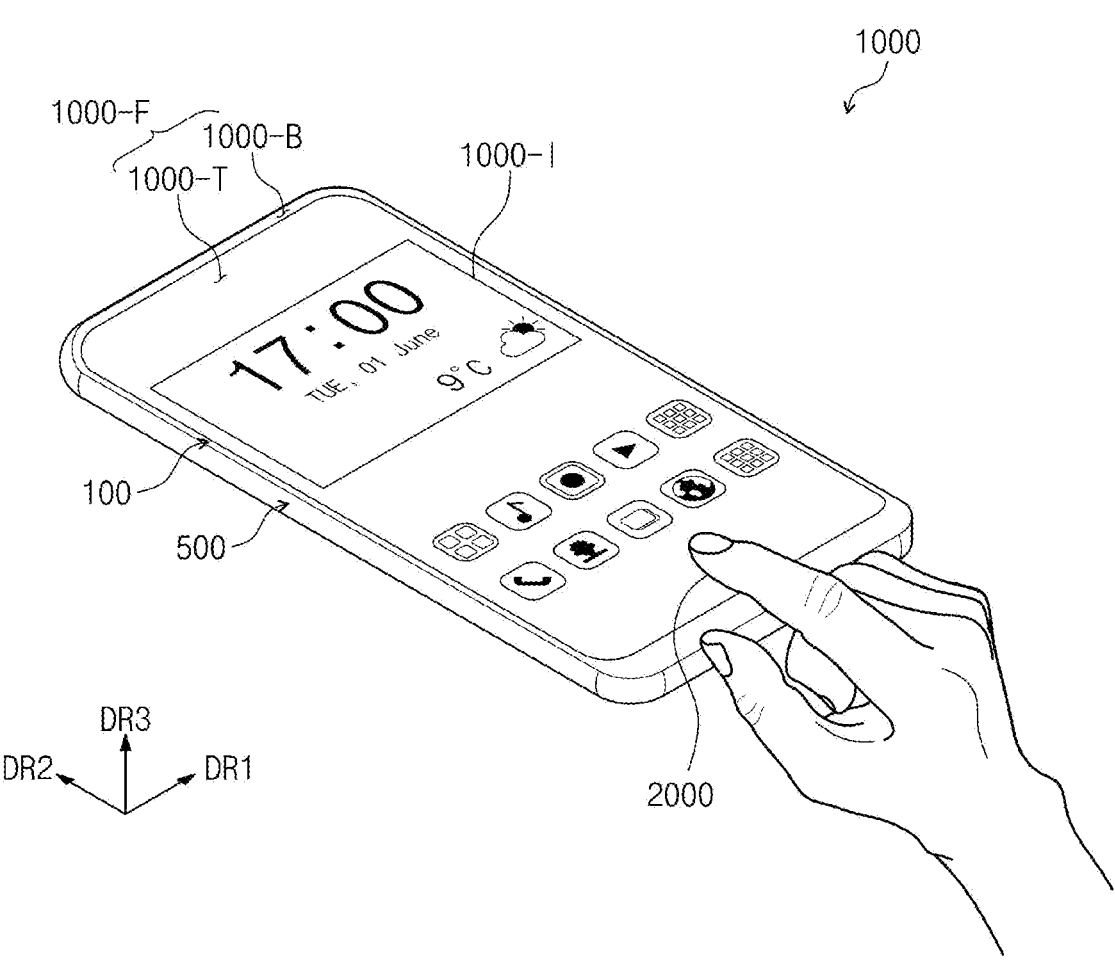
FIG. 1 is a perspective view of an electronic device 1000 according to an embodiment of the present inventive concept.

In this specification, when a component (or region, layer, portion, etc.) is referred to as "on", "connected", or "coupled" to another component, the component may be directly placed on, connected to, or coupled to the other component or a third component can be disposed between them.

The same reference numerals or symbols may refer to the same elements. In the drawings, various thicknesses, lengths, and angles are shown and while the arrangement shown does indeed represent an embodiment of the present inventive concept, it is to be understood that modifications of the various thicknesses, lengths, and angles may be possible within the spirit and scope of the present inventive concept and the present inventive concept is not necessarily limited to the particular thicknesses, lengths, and angles shown. "And/or" includes all combinations of one or more of the associated elements.

Terms such as first, second, etc. may be used to describe various components, but the components should not be limited by the terms. These terms are only used for the purpose of distinguishing one component from other components. For example, without departing from the scope of the present inventive concept, a first component may be referred to as a second component, and similarly, a second component may be referred to as a first component. It is to be understood that singular expressions such as "a", "an" and "the" include plural expressions unless the context clearly indicates otherwise.

In addition, terms such as "below", "lower", "above", "upper", and the like are used to describe the relationship between components shown in the drawings. The terms are relative concepts and are described based on the directions indicated in the drawings. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features.

Hereinafter, embodiments of the present inventive concept will be described with reference to the drawings.

Figure 2:
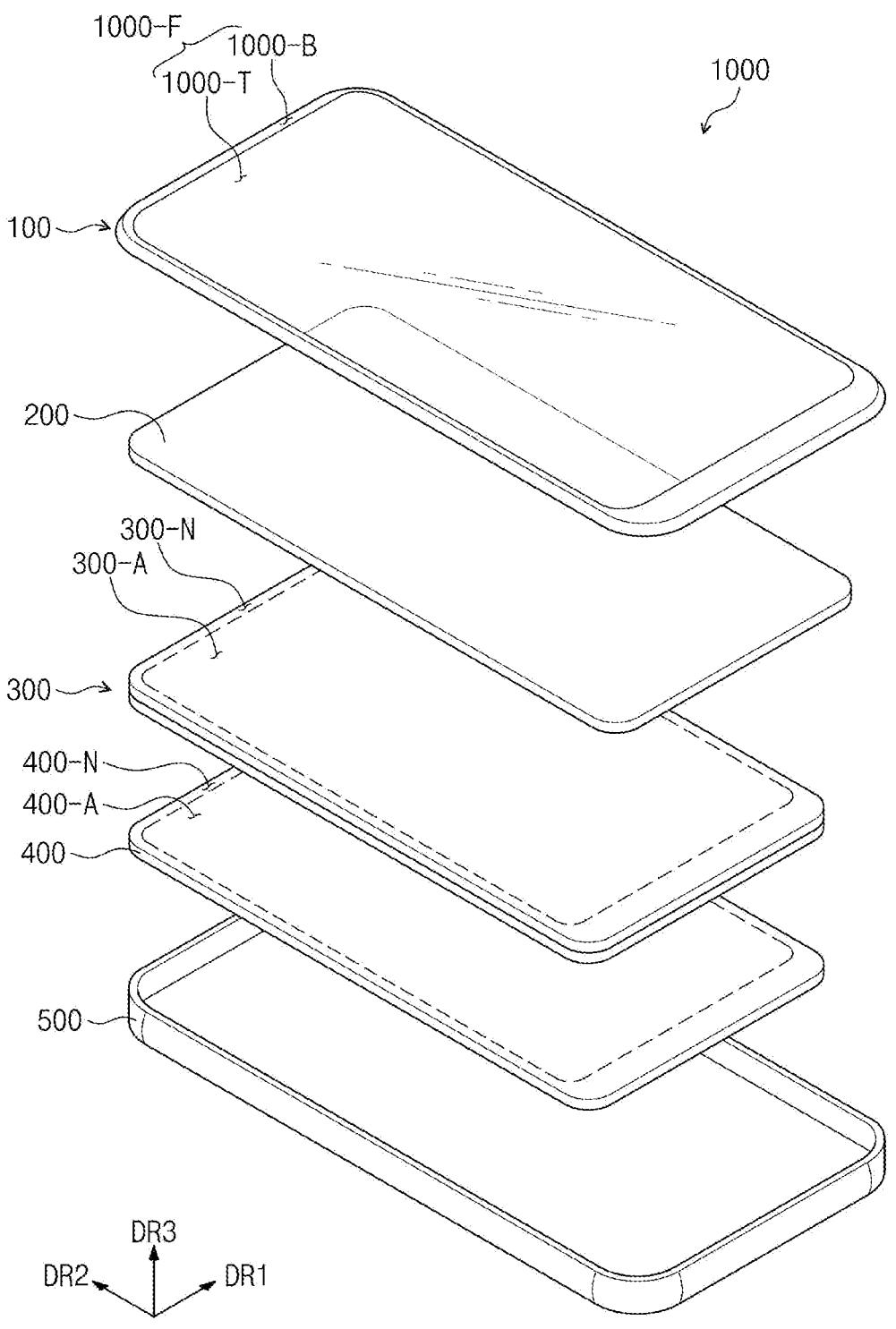
FIG. 2 is an exploded view of the electronic device 1000 according to an embodiment of the present inventive concept.

FIG. 1 is a perspective view of an electronic device 1000 according to an embodiment of the present inventive concept, and FIG. 2 is an exploded view of the electronic device 1000 according to an embodiment of the present inventive concept.

Referring to FIGS. 1 and 2, the electronic device 1000 may be a device which is activated in response to an electrical signal. The electronic device 1000 may include various embodiments. For example, the electronic device 1000 may be used in a small- and medium-sized electronic device such as a personal computer, a notebook computer, a personal digital terminal, a car navigation unit, a game console, a portable electronic device, or a camera, as well as a large-sized electronic device such as a television, a monitor, or an external billboard. In addition, these are merely presented as examples, and the electronic device 1000 may also be employed in other electronic devices without departing from the spirit and scope of the present inventive concept. In the present embodiment, the electronic device 1000 is illustrated as a smartphone, as an example.

The electronic device 1000 may display, in a third direction DR3, an image 1000-I on a display surface 1000-F parallel to each of a first direction DR1 and a second direction DR2 crossing the first direction DR1. The image 1000-I may include a static image as well as a dynamic image. FIG. 1 illustrates a clock window widget and icons as an example of the image 1000-I. The display surface 1000-F on which the image 1000-I is displayed may correspond to the front surface of the electronic device 1000, and to the front surface of a window 100.

In the present embodiment, the front surface (or upper surface) and the rear surface (or lower surface) of each member are defined on the basis of a direction in which the image 1000-I is displayed. The front surface and the rear surface may face each other in the third direction DR3, and the normal direction of each of the front surface and the rear surface may be parallel to the third direction DR3. It is to be understood that "when seen on a plane" may mean "when seen in the third direction DR3".

The electronic device 1000 according to an embodiment of the present inventive concept may sense a user's input applied from the outside. The user's input may include an external input having various forms such as a part of the user's body, light, heat, or pressure. In addition, the electronic device 1000 may sense the user's input applied to a side surface or the rear surface of the electronic device 1000 depending on the structure of the electronic device 1000, and present inventive concept is not limited thereto.

The electronic device 1000 may sense the user's fingerprint 2000 applied from the outside. A fingerprint recognition region may be provided on the display surface 1000-F of the electronic device 1000. The fingerprint recognition region may be provided on the entire region of a transmission region 1000-T, or a partial region of the transmission region 1000-T.

The electronic device 1000 may include a window 100, an anti-reflective panel 200, a display module 300, a sensing unit 400, and a housing 500. In the present embodiment, the window 100 and the housing 500 may be coupled to constitute the exterior of the electronic device 1000. In addition, the window 100 and the housing 500 may form an inner space therebetween.

The window 100 may include an optically transparent insulating material. For example, the window 100 may include glass or plastic. The window 100 may have a single-layered structure or a multi-layered structure. For example, the window 100 may include a plurality of plastic films bonded to each other with an adhesive, or a glass substrate and a plastic film bonded to each other with an adhesive.

As described above, the display surface 1000-F of the window 100 provides the front surface of the electronic device 1000. The transmission region 1000-T may be an optically transparent region. For example, the transmission region 1000-T may be a region having a visible light transmittance of about 90% or more.

A bezel region 1000-B may be a region having a relatively lower light transmittance than the transmission region 1000-T. The bezel region 1000-B defines the shape of the transmission region 1000-T. The bezel region 1000-B may be adjacent to the transmission region 1000-T, and may at least partially surround the transmission region 1000-T.

The bezel region 1000-B may have a predetermined color. The bezel region 1000-B may cover a peripheral region 300-N of the display module 300, and thus may block the peripheral region 300-N from being visible to the outside. In addition, the bezel region 1000-B may be omitted in the window 100 according to an embodiment of the present inventive concept.

The anti-reflective panel 200 may be disposed under the window 100. The anti-reflective panel 200 may reduce the reflectance of external light incident from above the window 100. In an embodiment of the present inventive concept, the anti-reflective panel 200 may be omitted, and may be a component included in the display module 300.

The display module 300 may display the image 1000-I, and may sense an external input. The display module 300 may include an active region 300-A and a peripheral region 300-N. The active region 300-A may be a region which is activated in response to an electric signal.

In the present embodiment, the active region 300-A may serve as both a region for displaying the image 1000-I and a region for sensing an external input. The transmission region 1000-T may overlap the active region 300-A. For example, the transmission region 1000-T may overlap the entire region of the active region 300-A, or at least a partial region of the active region 300-A. Accordingly, a user may view the image 1000-I through the transmission region 1000-T, or may provide an external input through the transmission region 1000-T. In an embodiment of the present inventive concept, a region for displaying the image 1000-I and a region for sensing an external input may be separated from each other, but an embodiment of the present inventive concept is not limited thereto.

The peripheral region 300-N may be a region covered by the bezel region 1000-B. The peripheral region 300-N is adjacent to the active region 300-A. The peripheral region 300-N may at least partially surround the active region

300-A. A driving circuit, a driving line or the like for driving the active region 300-A may be disposed in the peripheral region 300-N.

The sensing unit 400 may be disposed under the display module 300. For example, the sensing unit 400 may be a layer that senses user's biometric information. The sensing unit 400 may sense a surface of a touch target. The surface may include a surface uniformity, a surface flexure, or the like. For example, the surface may sense user's fingerprint 2000 information.

The sensing unit 400 may include a sensing region 400-A and a non-sensing region 400-N. The sensing region 400-A may be a region which is activated in response to an electrical signal. For example, the sensing region 400-A may be a region for sensing biometric information. A driving circuit, a driving line, or the like, for driving the sensing region 400-A may be disposed in the non-sensing region 400-N.

In an embodiment of the present inventive concept, the sensing region 400-A may overlap the active region 300-A. For example, the sensing region 400-A may overlap the entire active region 300-A. In this case, a fingerprint may be recognized throughout the active region 300A. For example, a user's fingerprint may be recognized in the entire region, not in a partial region limited to a specific region, but an embodiment of the present inventive concept is not limited thereto. For example, in an embodiment of the present inventive concept, the sensing region 400-A may overlap a part of the active region 300-A.

The housing 500 is coupled to the window 100. The housing 500 may be coupled to the window 100 to provide a predetermined inner space. The display module 300 and the sensing unit 400 may be accommodated in the inner space. The housing 500 may stably protect components of the electronic device 1000 accommodated in the inner space from an external impact. The housing 500 may include a material having a relatively high stiffness and rigidity. For example, the housing 500 may include glass, plastic, or metal, or a plurality of frames and/or plates composed of a combination thereof.

A battery module or the like, which supplies power for an overall operation of the electronic device 1000, may be disposed between the sensing unit 400 and the housing 500; however, the present inventive concept is not limited thereto, and for example, the battery module or the like may be positioned elsewhere in the housing 500.

Figure 3:
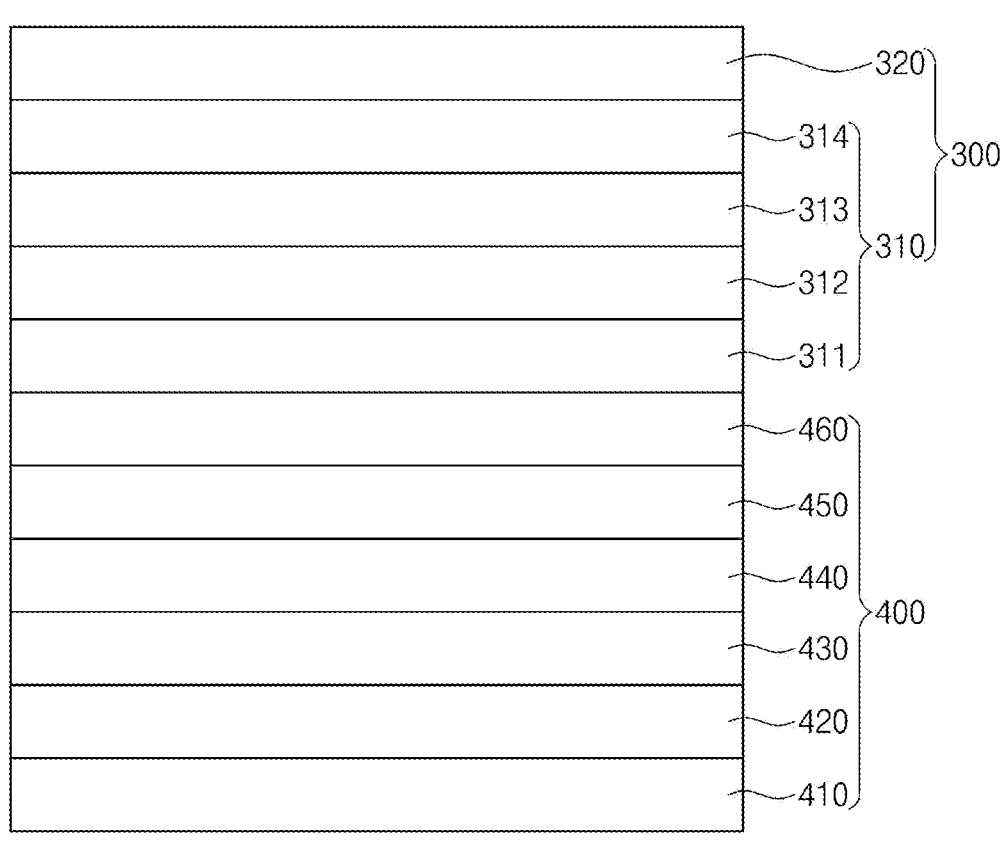
FIG. 3 is a cross-sectional view of a partial configuration of the electronic device according to an embodiment of the present inventive concept.
Figure 3:
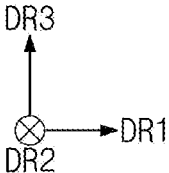

FIG. 3 is a cross-sectional view of a partial configuration of an electronic device according to an embodiment of the present inventive concept. FIG. 3 is a schematic cross-sectional view illustrating components included in a display module 300 and a sensing unit 400.

Referring to FIG. 3, the display module 300 may include a display layer 310 and a sensing layer 320.

The display layer 310 may provide an image 1000-I (see FIG. 1). An active region 300-A of the display module 300 may correspond to an active region of the display layer 310. In an embodiment of the present inventive concept, when a sensing region 400-A (see FIG. 2) of the sensing unit 400 overlaps the entire active region 300-A, the sensing region 400-A (see FIG. 2) may overlap the entire active region of the display layer 310.

The display layer 310 may be an emissive display layer, and is not specially limited. For example, the display layer 310 may include an organic light-emitting display layer, a quantum dot light-emitting display layer, a micro-LED display layer, or a nano LED display layer. The organic light-emitting display layer may include an organic light-emitting material. The quantum dot light-emitting display layer may include quantum dots, quantum rods, etc. The micro-LED display layer may include a micro-LED. The nano LED display layer may include a nano LED The display layer 310 may include a base layer 311, a circuit layer 312, a light-emitting element layer 313, and an encapsulation layer 314.

The base layer 311 may include a synthetic resin layer. The synthetic resin layer may include a thermosetting resin. For example, the synthetic resin layer may be a polyimide-based resin layer, and the material thereof is not specially limited. The synthetic resin layer may include at least one of an acryl-based resin, a methacryl-based resin, a polyiso-prene-based resin, a vinyl-based resin, an epoxy-based resin, a urethane-based resin, a cellulose-based resin, a siloxane-based resin, a polyamide-based resin, and/or a perylene-based resin. In addition, the base layer 311 may include a glass substrate, a metal substrate, an organic/inorganic composite material substrate, or the like.

The circuit layer 312 may be disposed on the base layer 311. The circuit layer 312 may include a pixel circuit and insulating layers. The pixel circuit may include at least one transistor and at least one capacitor.

The light-emitting element layer 313 may be disposed on the circuit layer 312. The light-emitting element layer 313 may generate light. The light-emitting element layer 313 may generate light or control the amount of light in response to an electrical signal. When the display layer 310 is an organic light-emitting display panel, the light-emitting element layer 313 may include an organic light-emitting material. When the display layer 310 is a quantum dot light-emitting display layer, the light-emitting element layer 313 may include quantum dots, quantum rods, or the like.

The encapsulation layer 314 may be disposed on the light-emitting element layer 313. The encapsulation layer 314 may include at least one insulating layer. For example, the encapsulation layer 314 may include at least one inorganic film and at least one organic film. The inorganic film may protect the light-emitting element layer 313 from moisture and oxygen, and the organic film may protect the light-emitting element layer 313 from foreign matters such as dust particles.

The sensing layer 320 may be disposed on the display layer 310. The sensing layer 320 may sense an external input, and thus may obtain position information of the external input. The external input may include various embodiments. For example, the external input may include various forms of external inputs such as a part of a user's body, light, heat, pressure, or a touch object (e.g., a stylus). In addition, the sensing layer 320 may sense not only an input in contact with the window 100 but also an input close to or adjacent to the window 100 (see FIG. 2).

The sensing layer 320 may be directly disposed on the display layer 310. For example, the display layer 310 and the sensing layer 320 may be formed through a continuous process. In an embodiment of the present inventive concept, the sensing layer 320 may be adhered to the display layer 310. In this case, an adhesive layer may be disposed between the display layer 310 and the sensing layer 320.

The sensing unit 400 may be disposed on the display module 300. For example, the sensing unit 400 may be disposed under the display module 300. For example, the sensing unit 400 may be adhered to the rear surface of the display layer 310.

The sensing unit 400 may include a base layer 410, a biometric information sensing layer 420, a first adhesive layer 430, an optical pattern layer 440, a light collecting layer 450, and a second adhesive layer 460.

The base layer 410 may include a synthetic resin layer. The synthetic resin layer may include a thermosetting resin. For example, the synthetic resin layer may be a polyimide-based resin layer, and the material thereof is not specially limited. For example, the base layer 410 may include two polyimide-based resin layers, and a barrier layer disposed between the polyimide-based resin layers. The barrier layer may include amorphous silicon and silicon oxide.

The biometric information sensing layer 420 may be disposed on the base layer 410. The biometric information sensing layer 420 may include a sensing circuit and insulating layers. For example, the sensing circuit may include at least one transistor and at least one photodiode.

The first adhesive layer 430 may be disposed on the biometric information sensing layer 420. The first adhesive layer 430 may be an optically transparent adhesive member. The first adhesive layer 430 may include a typical adhesive or bonding agent. The first adhesive layer 430 according to an embodiment of the present inventive concept may be omitted.

The optical pattern layer 440 may be disposed on the first adhesive layer 430. However, this is an example, and the stacking relationship of the sensing unit 400 according to an embodiment of the present inventive concept is not limited thereto. For example, the optical pattern layer 440 may be directly disposed on the biometric information sensing layer 420.

The light collecting layer 450 may be disposed on the optical pattern layer 440. The light collecting layer 450 may increase the amount of light received by the biometric information sensing layer 420. The light collecting layer 450 may include a lens array. However, this is an example, and the light collecting layer 450 may include a prism sheet. The light collecting layer 450 will be described later.

The second adhesive layer 460 may be disposed on the light collecting layer 450. The second adhesive layer 460 may be an optically transparent adhesive member. The second adhesive layer 460 may include a typical adhesive or bonding agent. For example, the second adhesive layer 460 may be used to bond the display module 300 to the sensing unit 400.

Figure 4:
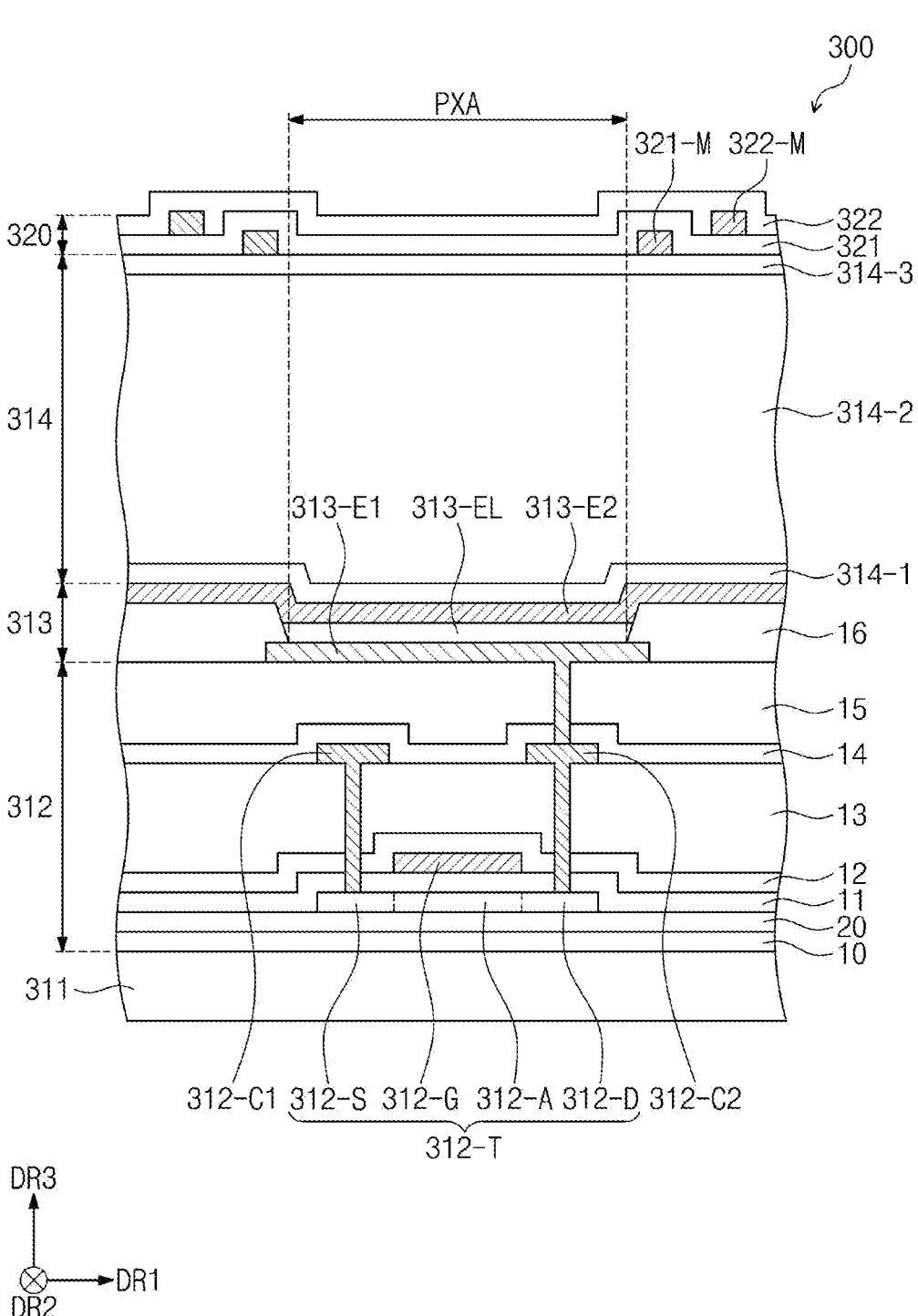
FIG. 4 is a cross-sectional view illustrating a display module according to an embodiment of the present inventive concept.

FIG. 4 is a cross-sectional view illustrating a display module according to an embodiment of the present inventive concept. In the description of FIG. 4, the same reference numerals or symbols are used for the components described with reference to FIG. 3, and a description thereof will be omitted to prevent having redundant descriptions.

Referring to FIG. 4, a circuit layer 312, a light-emitting element layer 313, an encapsulation layer 314, and a sensing layer 320 may be sequentially disposed on the base layer 311.

The circuit layer 312 may be disposed on the base layer 311. The circuit layer 312 may include a barrier layer 10, a buffer layer 20, a semiconductor pattern 312-T, a first insulating layer 11, a gate 312-G, a second insulating layer 12, a third insulating layer 13, first and second connection electrodes 312-C1 and 312-C2, a fourth insulating layer 14, and a fifth insulating layer 15.

The barrier layer 10 may be disposed on the base layer 311. The barrier layer 10 may prevent foreign matter or particles from infiltrating the display module 300. For example, the barrier layer 10 may include at least any one of a silicon oxide layer and/or a silicon nitride layer. The silicon oxide layer and the silicon nitride layer may be each provided in plurality, and the silicon oxide layers and the silicon nitride layers may be alternately stacked on each other.

The buffer layer 20 may be disposed on the barrier layer 10. The buffer layer 20 may increase an adhesive force between the base layer 311 and a semiconductor pattern (e.g., 312-T) and/or a conductive pattern. The buffer layer 20 may include at least one of a silicon oxide layer and/or a silicon nitride layer. The silicon oxide layer and the silicon nitride layer may be alternately stacked on each other.

The semiconductor pattern 312-T of a pixel circuit may be disposed on the buffer layer 20. The semiconductor pattern 312-T may include an active 312-A, a source 312-S, a drain 312-D, and a gate 312-G.

Semiconductor patterns 312-S, 312-A, and 312-D are disposed on the buffer layer 20. Hereinafter, for example, the semiconductor patterns 312-S, 312-A, and 312-D directly disposed on the buffer layer 20 may include a silicon semiconductor, a polysilicon semiconductor, or an amorphous silicon semiconductor. The semiconductor patterns 312-S, 312-A, and 312-D have electrical properties varying depending on whether if they are doped or not. The semiconductor patterns 312-S, 312-A, and 312-D may include a doped region and an undoped region. The doped region may be doped with N-type dopants or P-type dopants. A P-typed transistor includes a doped region doped with P-type dopants.

The doped region has a higher conductivity than the undoped region, and substantially serves as an electrode and/or a signal line. The undoped region substantially corresponds to an active (or channel) of a transistor. In other words, a part of the semiconductor patterns 312-S, 312-A, and 312-D may be the active 312-A of the semiconductor pattern 312-T, another part may be the source 312-S or the drain 312-D, and another part may be a connection signal line (or connection electrode).

The first insulating layer 11 is disposed on the buffer layer 20, and covers the semiconductor patterns 312-S, 312-A, and 312-D. The first insulating layer 11 may be an inorganic layer and/or an organic layer, and may have a single- or multi-layered structure. For example, the first insulating layer 11 may include at least one of aluminum oxide, titanium oxide, silicon oxide, silicon oxynitride, zirconium oxide, and/or hafnium oxide. In the present embodiment, the first insulating layer 11 may be a single-layered silicon oxide layer. An inorganic layer to be described later may include at least one of the aforementioned materials.

The gate 312-G may be disposed on the first insulating layer 11. The gate 312-G may be a part of a metal pattern. The gate 312-G may overlap the active 312-A in a third direction DR3. The gate 312-G may function as a mask in a doping process of a semiconductor pattern.

The second insulating layer 12 may be disposed on the first insulating layer 11, and may cover the gate 312-G. For example, the second insulating layer 12 may be an inorganic layer, and may have a single- or multi-layered structure. In the present embodiment, the second insulating layer 12 may be a single-layered silicon oxide layer; however, the present inventive concept is not limited thereto. For example, the second insulating layer 12 may be a multi-layered structure.

The third insulating layer 13 may be disposed on the second insulating layer 12. For example, the third insulating layer 13 may be an organic layer, and may have a single- or multi-layered structure. For example, the third insulating layer 13 may be a single-layered polyimide-based resin layer, but an embodiment of the present inventive concept is not limited thereto. For example, the third insulating layer

13 may include at least any one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, and/or a perylene-based resin. An organic layer to be described later may include at least one of the aforementioned materials.

A first connection electrode 312-C1 and a second connection electrode 312-C2 may be disposed on the third insulating layer 13. The first connection electrode 312-C1 and the second connection electrode 312-C2 may each penetrate first to third insulating layers 11, 12, and 13, and may be electrically connected to the semiconductor pattern 312-T.

The fourth insulating layer 14 may be disposed on the third insulating layer 13, and may cover the first connection electrode 312-C1 and the second connection electrode 312-C2. For example, the fourth insulating layer 14 may be an inorganic layer.

The fifth insulating layer 15 may be disposed on the fourth insulating layer 14. For example, the fifth insulating layer 15 may be an organic layer, and may have a single- or multi-layered structure.

The light-emitting element layer 313 may be disposed on the fifth insulating layer 15. The light-emitting element layer 313 may include a first electrode 313-E1, a light-emitting layer 313-EL, and a second electrode 313-E2.

The first electrode 313-E1 may penetrate the fourth insulating layer 14 and the fifth insulating layer 15, and may be electrically connected to the semiconductor pattern 312-T. For example, the first electrode 313-E1 may be electrically connected to the second connection electrode 312-C2. The first electrode 313-E1 may overlap at least Y transmission parts 431 (see FIG. 6). Y may be a positive integer, and a description of the transmission parts 431 (see FIG. 6) will be made later.

The pixel-defining film 16 may be disposed on the fifth insulating layer 15. An opening, which exposes the first electrode 313-E1, may be defined in the pixel-defining film 16. The shape of the opening may correspond to a pixel region PXA on a plane.

The light-emitting layer 313-EL may be disposed on the first electrode 313-E1. The light-emitting layer 313-EL may provide light having a predetermined color. In the present embodiment, the light-emitting layer 313-EL having a patterned single layer is illustrated as an example, but an embodiment of the present inventive concept is not limited thereto. For example, the light-emitting layer 313-EL may have a multi-layered structure. In addition, the light-emitting layer 313-EL may extend toward the upper surface of the pixel-defining film 16.

The second electrode 313-E2 may be disposed on the light-emitting layer 313-EL. An electron control layer may be disposed between the second electrode 313-E2 and the light-emitting layer 313-EL, and a hole control layer may be disposed between the first electrode 313-E1 and the light-emitting layer 313-EL.

In an embodiment of the present inventive concept, the first electrode 313-E1 and the second electrode 313-E2 may each include a transparent conductive material. For example, the first electrode 313-E1 and the second electrode 313-E2 may each include at least one of indium tin oxide (ITO), indium zinc oxide (IZO), indium gallium oxide (IGO), indium gallium zin oxide (IGZO), and/or a mixture/compound thereof, but an embodiment of the present inventive concept is not limited thereto.

The encapsulation layer 314 may be disposed on the second electrode 313-E2. The encapsulation layer 314 may include a first inorganic layer 314-1, an organic layer 314-2, and a second inorganic layer 314-3.

The first inorganic layer 314-1 may be disposed on the second electrode 313-E2. The organic layer 314-2 may be disposed on the first inorganic layer 314-1. The second inorganic layer 314-3 may be disposed on the organic layer 314-2, and may cover the organic layer 314-2. The first inorganic layer 314-1 and the second inorganic layer 314-3 may include, for example, a silicon nitride layer, a silicon oxynitride layer, a silicon oxide layer, a titanium oxide layer, an aluminum oxide layer, or the like, but an embodiment of the present inventive concept is not limited thereto. For example, the organic layer 314-2 may include an acryl-based organic layer, but an embodiment of the present inventive concept is not limited thereto. The first inorganic layer 314-1 and the second inorganic layer 314-3 may protect first to third light-emitting layers EL1, EL2, and EL3 from moisture/oxygen, and the organic layer 314-2 may protect the first to third light-emitting layers EL1, EL2, and EL3 from foreign matter such as dust particles.

The sensing layer 320 may be disposed on the encapsulation layer 314. The sensing layer 320 may include a first conductive layer 321-M, a first sensing insulating layer 321, a second conductive layer 322-M, and a second sensing insulating layer 322. At least one of the first conductive layer 321-M or the second conductive layer 322-M may include sensing electrodes. The sensing layer 320 may obtain information pertaining to an external input through a change in capacitance between the sensing electrodes.

Figure 5:
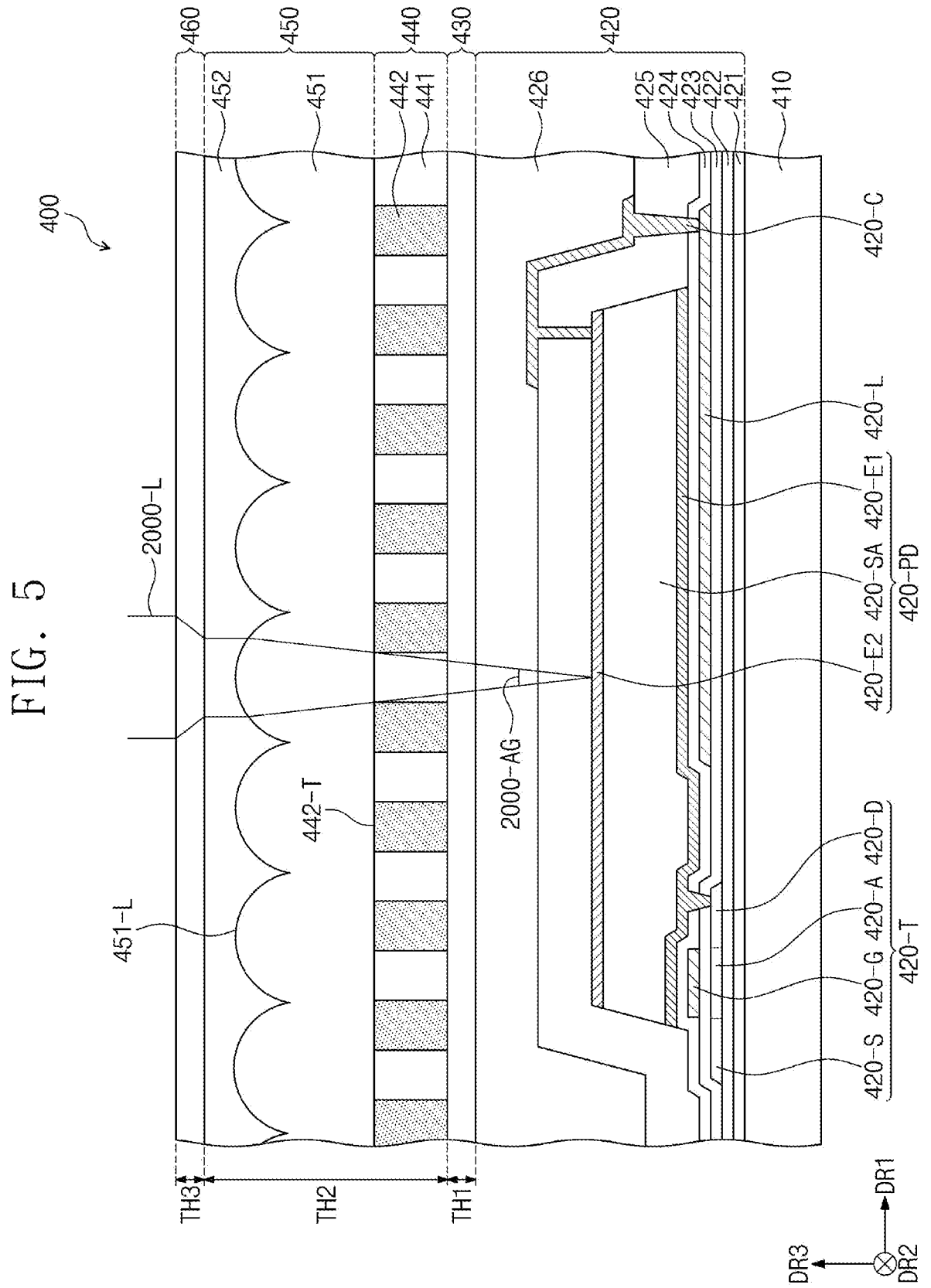
FIG. 5 is a cross-sectional view of a sensing unit according to an embodiment of the present inventive concept.
Figure 6:
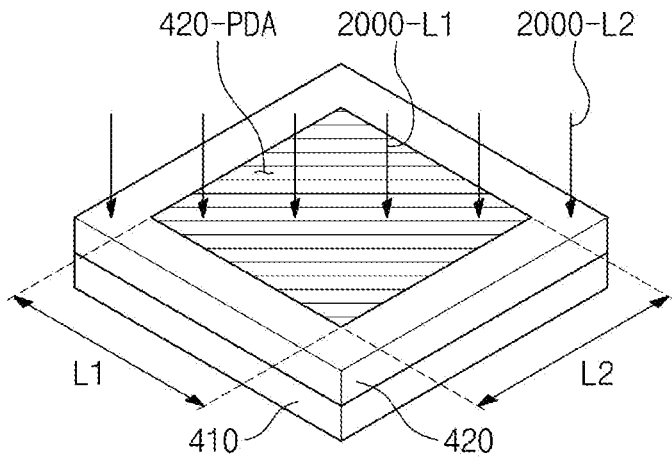
FIG. 6 is a perspective view illustrating a part of a sensing unit according to an embodiment of the present inventive concept.
Figure 6:
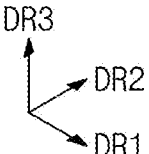

FIG. 5 is a cross-sectional view of a sensing unit according to an embodiment of the present inventive concept, and FIG. 6 is a perspective view illustrating a part of a sensing unit according to an embodiment of the present inventive concept. In the description of FIG. 5, the same reference numerals or symbols are used for the components described with reference to FIG. 3, and a description thereof will be omitted to prevent redundant descriptions.

Referring to FIGS. 5 and 6, a sensing unit 400 may include a base layer 410, a biometric information sensing layer 420, a first adhesive layer 430, an optical pattern layer 440, a light collecting layer 450, and a second adhesive layer 460.

The biometric information sensing layer 420 may include a barrier layer 421, a transistor 420-T, a buffer layer 422, a first insulating layer 423, a second insulating layer 424, a sensor 420-PD, a third insulating layer 425, and a fourth insulating layer 426.

The barrier layer 421 may be disposed on the base layer 410. The buffer layer 422 may be disposed on the barrier layer 421. The description of the barrier layer 421 and the buffer layer 422 may correspond to the barrier layer 10 and the buffer layer 20 described above in FIG. 4.

The transistor 420-T may be disposed on the buffer layer 422. The transistor 420-T may include an active 420-A, a source 420-S, a drain 420-D, and a gate 420-G. The active 420-A, the source 420-S, and the drain 420-D may be disposed on the buffer layer 422.

The first insulating layer 423 may be disposed on the buffer layer 422, and may cover the active 420-A, the source 420-S, and the drain 420-D. For example, the first insulating layer 423 may be an inorganic layer and/or an organic layer, and may have a single- or multi-layered structure. In the present embodiment, the first insulating layer 423 may be a single-layered silicon oxide layer.

The gate 420-G and a wiring layer 420-L may be disposed on the first insulating layer 423. A predetermined voltage, for example, a bias voltage may be provided to the wiring layer 420-L. The wiring layer 420-L may be electrically connected to the sensor 420-PD that is to be described later.

The second insulating layer 424 may be disposed on the first insulating layer 423, and may cover the gate 420-G and the wiring layer 420-L. For example, the second insulating layer 424 may be an inorganic layer, and may have a single- or multi-layered structure. In the present embodiment, the second insulating layer 424 may be a single-layered silicon oxide layer.

The sensor 420-PD may be disposed on the second insulating layer 424. The sensor 420-PD may be electrically connected to the transistor 420-T and the wiring layer 420-L. For example, the operation of the sensor 420-PD may be controlled by a signal provided from the transistor 420-T, and the sensor 420-PD may receive a predetermined voltage from the wiring layer 420-L.

The sensor 420-PD may include a first sensing electrode 420-E1, a sensing layer 420-SA, and a second sensing electrode 420-E2.

The first sensing electrode 420-E1 may penetrate the first insulating layer 423 and the second insulating layer 424 to be electrically connected to the transistor 420-T. For example, the first sensing electrode 420-E1 may include an opaque conductive material. For example, the first sensing electrode 420-E1 may include molybdenum (Mo).

The sensing layer 420-SA may be disposed on the first sensing electrode 420-E1. The sensing layer 420-SA may include, for example, amorphous silicon.

The second sensing electrode 420-E2 may be disposed on the sensing layer 420-SA. For example, the second sensing electrode 420-E2 may include a transparent conductive material. For example, the second sensing electrode 420-E2 may include indium tin oxide (ITO).

The third insulating layer 425 may be disposed on the second sensing electrode 420-E2. For example, the third insulating layer 425 may be an inorganic layer, and may have a single- or multi-layered structure. For example, the third insulating layer 425 may include a silicon oxide layer and a silicon nitride layer.

The connection electrode 420-C may be disposed on the third insulating layer 425. The connection electrode 420-C may penetrate the third insulating layer 425 to be electrically connected to the second sensing electrode 420-E2. In addition, the connection electrode 420-C may penetrate the second insulating layer 424 and the third insulating layer 425 to be electrically connected to the wiring layer 420-L.

The fourth insulating layer 426 may be disposed on the third insulating layer 425, and may cover the connection electrode 420-C. For example, the fourth insulating layer 426 may be an organic layer, and may have a single- or multi-layered structure. For example, the fourth insulating layer 426 may be a single-layered polyimide-based resin layer.

The first adhesive layer 430 may be disposed on the biometric information sensing layer 420. The first adhesive layer 430 may have a first thickness TH1. The first thickness TH1 may be about 10 μm to about 20 μm. For example, the first thickness TH1 may be about 15 μm.

The first adhesive layer 430 may have a refractive index of about 1.3 to about 1.5. For example, the first adhesive layer 430 may have a refractive index of about 1.474. However, this is an example, and the first adhesive layer 430 according to an embodiment of the present inventive concept may be omitted. In this case, the optical pattern layer

440 may be directly disposed on the biometric information sensing layer 420. For example, the biometric information sensing layer 420 and the optical pattern layer 440 may be formed through a continuous process.

The optical pattern layer 440 may be disposed on the first adhesive layer 430. The optical pattern layer 440 may include a plurality of transmission parts 441 and a light shielding part 442. The plurality of transmission parts 441 may have optical transparency. The light shielding part 442 may shield light. The light shielding part 442 may include, for example, metal or graphite.

The plurality of transmission parts 441 may function as filters which selectively transmit, among light reflected from a user's finger, only part of reflected light matching a predetermined direction and/or angle.

The light collecting layer 450 may be disposed on the optical pattern layer 440. The light collecting layer 450 may include a refractive layer 451 and a cover layer 452.

The refractive layer 451 may be disposed on the optical pattern layer 440. The refractive layer 451 may include a lens array.

The lens array may include a plurality of lenses 451-L. The plurality of lenses 451-L may be each disposed along the first direction DR1 and the second direction DR2. The plurality of lenses 451-L may each include a spherical lens or an aspherical lens. The lens array may refract light 2000-L reflected from a fingerprint 2000 (see FIG. 1). The light 2000-L provided to the lens array may be refracted by each of the plurality of lenses 451-L and be provided to the optical pattern layer 440.

The refractive layer 451 may have a first refractive index. The first refractive index may be about 1.5 to about 1.7. For example, the first refractive index may be about 1.68. The first refractive index may be greater than the refractive index of the first adhesive layer 430.

The cover layer 452 may be disposed on the refractive layer 451. The cover layer 452 may include an infrared filter. However, this is an example, and the cover layer 452 according to an embodiment of the present inventive concept may also include a low refractive resin. The infrared filter may interrupt transmission of infrared light, and may transmit visible light. The light 2000-L which is reflected from a user's fingerprint 2000 (see FIG. 1) may be visible light.

According to an embodiment of the present inventive concept, since the cover layer 452 shields light having a wavelength band other than the wavelength band of light 2000-L reflected by the fingerprint 2000, the fingerprint recognition accuracy of the biometric information sensing layer 420 may be increased.

The cover layer 452 may have a second refractive index. The second refractive index may be about 1.18 to about 1.2. The second refractive index may be smaller than the first refractive index of the refractive layer 451.

The optical pattern layer 440 and the light collecting layer 450 may have a second thickness TH2. The second thickness TH2 may be about 60 μm to about 80 μm. For example, the second thickness TH2 may be about 70 μm.

The second adhesive layer 460 may be disposed on the light collecting layer 450. The second adhesive layer 460 may have a third thickness TH3. The third thickness TH3 may be about 10 μm to about 20 μm. For example, the third thickness TH3 may be about 15 μm.

The second adhesive layer 460 may have a refractive index of about 1.3 to about 1.5. For example, the second adhesive layer 460 may have a refractive index of about 1.474.

When seen on a plane, a first side L1 of the sensor 420-PD may be about 40 μm to about 60 μm. A second side L2 of the sensor 420-PD may be about 40 μm to about 60 μm. When seen on a plane, an area 420-PDA of the sensor 420-PD may be about 40 μm×about 40 μm to about 60 μm×about 60 μm.

The light 2000-L reflected from the fingerprint 2000 (see FIG. 1) may be refracted in the light collecting layer 450. The light 2000-L refracted in the light collecting layer 450 may be transmitted by the plurality of transmission parts 441 to be incident onto the sensor 420-PD.

The light 2000-L reflected from the fingerprint 2000 (see FIG. 1) may include first light 2000-L1 and second light 2000-L2. The first light 2000-L1 may overlap the sensor 420-PD. The second light 2000-L2 might not overlap the sensor 420-PD.

A fill factor (FF) may mean a ratio of the amount of the first light 2000-L1 received by the sensor 420-PD to the total amount of the light 2000-L. The fill factor may be about 10% to 100%. When the fill factor is less than about 10%, the amount of the light 2000-L received by the sensor 420-PD may be insufficient, so that the sensor 420-PD might not sense the fingerprint 2000 (see FIG. 1).

A field of view 2000-AG (FOV) may mean an observation field of view in a predetermined angular range of the light 2000-L incident onto the sensor 420-PD. The light 2000-L may be incident onto the sensor 420-PD in an oblique direction due to the optical pattern layer 440 and the light collecting layer 450. For example, the optical pattern layer 440 and the light collecting layer 450 may transmit light reflected from a user's finger in a direction approximately perpendicular to the sensor 420-PD. The field of view of the light 2000-L incident in the perpendicular direction may be about 0°. When a fingerprint is sensed using the light 2000-L having a relatively narrow field of view, the contrast of the fingerprint may become clearer, so that a fingerprint pattern may be recognized more easily.

When the fill factor of the sensor 420-PD is greater than about 70% and equal to or less than 100%, the field of view 2000-AG of the light 2000-L provided to the sensor 420-PD may be about 1° to about 7°. The optical pattern layer 440 and the light collecting layer 450 may be designed to transmit the light 2000-L satisfying the field of view 2000-AG of about 1° to about 7°.

Table 1 is a table showing the measurement result of a signal-to-noise ratio (SNR) depending on the field of view when the fill factor of the sensor 420-PD is greater than about 70% and equal to or less than 100%. Table 1 shows, as an example, the measured value of an average signal-to-noise ratio depending on the range of the field of view. When light is directly sensed by the sensor 420-PD, a signal-to-noise ratio may be about 20 dB. For example, the optimal signal-to-noise ratio of the sensor 420-PD may be about 20 dB.

TABLE 1

| FOV | about 1° to about 7° | greater than about 7° and equal to or less than about 30° |
|---|---|---|
| SNR | 14.5 dB | 3.2 dB |

Referring to the Table 1, unlike the present inventive concept, when the fill factor is greater than about 70% and equal to or less than 100%, and light with a field of view greater than about 7° and equal to or less than about 30° is provided, a signal-to-noise ratio may be about 3.2 dB. That is, the fingerprint recognition accuracy or sensitivity of the sensing unit 400 may be reduced. However, according to an embodiment of the present inventive concept, when the fill factor is greater than about 70% and equal to or less than 100%, the optical pattern layer 440 and the light collecting layer 450 may be designed to provide the light 2000-L with a field of view of about 1° to about 7°. In this case, the signal-to-noise ratio may be about 14.5 dB. When the fill factor is greater than about 70% and equal to or less than 100%, and the field of view 2000-AG is about 1° to about 7°, the sensor 420-PD may have a signal-to-noise ratio of about 14.5 dB, which is relatively near to about 20 dB. The fingerprint recognition accuracy of the sensing unit 400 may be sufficiently ensured. Accordingly, an electronic device 1000 (see FIG. 1), which has increased fingerprint recognition reliability, may be provided. When the fill factor of the sensor 420-PD is about 10% to about 70%, the light 2000-L provided to the sensor 420-PD may have a field of view 2000-AG of about 15° to about 30°. The optical pattern layer 440 and the light collecting layer 450 may be designed to transmit the light 2000-L satisfying the field of view 2000-AG of about 15° to about 30°.

Table 2 is a table showing the measurement result of a signal-to-noise ratio (SNR) depending on the field of view when the fill factor of the sensor 420-PD is about 10% to about 70%. Table 2 shows, as an example, the measured value of an average signal-to-noise ratio depending on the range of the field of view.

TABLE 2

| FOV | about 1° and less than about 15° | about 15° to about 30° |
|-----|----------------------------------|------------------------|
| SNR | 2.5 dB | 15.7 dB |

Referring to the Table 2, unlike the present inventive concept, when the fill factor is about 10% to about 70%, and light with a field of view of about 1° and less than about 15° is provided, a signal-to-noise ratio may be about 2.5 dB. That is, the fingerprint recognition accuracy or sensitivity of the sensing unit 400 may be reduced. However, according to the present inventive concept, when the fill factor is about 10% to about 70%, the optical pattern layer 440 and the light collecting layer 450 may be designed to provide the light 2000-L with a field of view of about 15° to about 30°. In this case, the signal-to-noise ratio may be about 15.7 dB. When the fill factor is about 10% to about 70%, and the field of view 2000-AG is about 15° to about 30°, the sensor 420-PD may have a signal-to-noise ratio of about 15.7 dB, which is relatively near to about 20 dB. The fingerprint recognition accuracy of the sensing unit 400 may be sufficiently ensured. Accordingly, an electronic device 1000 (see FIG. 1) with increased fingerprint recognition reliability may be provided. A cross-talk may be a value measured due to a component unnecessary for fingerprint recognition of the sensing unit 400. For example, part of the light 2000-L provided to the optical pattern layer 440 may be provided to the biometric information sensing layer 420 through the plurality of transmission parts 441. Another part of the light 2000-L may be shielded by the shielding part 442. While another part of the light 2000-L may be reflected by the upper surface 442-T of the shielding part 442 and provided to the light collecting layer 450. The light provided to the light collecting layer 450 may be reflected between the refractive layer 451 and the cover layer 452 and provided to the optical pattern layer 440 again. At this time, the light provided to the optical pattern layer 440 again may be transmitted through the plurality of transmission parts 441 to be provided to the biometric information sensing layer 420. Accordingly, the measured value may be a component unnecessary for fingerprint recognition of the sensing unit 400. A cross-talk component may occur due to the measured value.

When the fill factor of the sensor 420-PD is greater than about 70% and equal to or less than 100%, a proportion of the cross-talk component of the sensor 420-PD may be about 1% to about 5%. The optical pattern layer 440 and the light collecting layer 450 may be designed to have a proportion of the cross-talk component of about 1% to about 5%.

When the fill factor of the sensor 420-PD is greater than about 70% and equal to or less than 100%, the amount of the light 2000-L may be sufficiently ensured. When the amount of light is ensured, an effect caused by the cross-talk component may be increased. Unlike the present inventive concept, when the proportion of the cross-talk component of the sensor 420-PD is greater than about 5%, a noise caused by the cross-talk component may be increased. The signal-to-noise ratio of the sensor 420-PD may be reduced. However, according to the present inventive concept, when the fill factor of the sensor 420-PD is greater than about 70% and equal to or less than 100%, the optical pattern layer 440 and the light collecting layer 450 may be designed to have a proportion of the cross-talk component of about 1% to about 5%. The signal-to-noise ratio of the sensor 420-PD may be improved. That is, the fingerprint recognition accuracy of the sensing unit 400 may be increased. Accordingly, an electronic device 1000 (see FIG. 1) with increased fingerprint recognition reliability may be provided.

When the fill factor of the sensor 420-PD is about 10% to about 70%, a proportion of the cross-talk component of the sensor 420-PD may be about 1% to about 10%. The optical pattern layer 440 and the light collecting layer 450 may be designed to have a proportion of the cross-talk component of about 1% to about 10%.

When the fill factor of the sensor 420-PD is about 10% to about 70%, it is likely that the amount of the light 2000-L is not sufficiently ensured. Unlike the present inventive concept, when the field of view 2000-AG is about 1° and less than about 15°, the amount of light might not be sufficiently ensured. The strength of a signal sensed by the sensing unit 400 may be reduced. The signal-to-noise ratio of the sensor 420-PD may be reduced. However, according to the present inventive concept, when the fill factor of the sensor 420-PD is about 10% to about 70%, the optical pattern layer 440 and the light collecting layer 450 may be designed to provide the light 2000-L with a field of view 2000-AG of about 15° to about 30°. The amount of the light 2000-L provided to the sensor 420-PD may be increased. The strength of the signal sensed by the sensor 420-PD may be increased. The signal-to-noise ratio of the sensor 420-PD may be improved. That is, the fingerprint recognition accuracy of the sensing unit 400 may be sufficiently ensured. Accordingly, an electronic device 1000 (see FIG. 1) with increased fingerprint recognition reliability may be provided.

According to an embodiment of the present inventive concept, the optical pattern layer 440 and the light collecting layer 450 may be variously designed on the basis of the fill factor of the sensor 420-PD so as to increase a fingerprint recognition function. When the fill factor is about 10% to about 70%, the field of view 2000-AG of the light 2000-L may be about 15° to about 30°, and the proportion of the cross-talk component of the sensor 420-PD may be about 1% to about 10%. When the fill factor is greater than about 70% and equal to or less than 100%, the field of view 2000-AG of the light 2000-L may be about 1° to about 7°, and the proportion of the cross-talk component of the sensor 420-PD may be about 1% to about 5%. The signal-to-noise ratio of the sensor 420-PD may be improved by designing as described above according to an embodiment of the present inventive concept. The fingerprint recognition accuracy of the sensing unit 400 may be increased. Accordingly, an electronic device 1000 (see FIG. 1) with increased fingerprint recognition reliability may be provided.

Figure 7A:
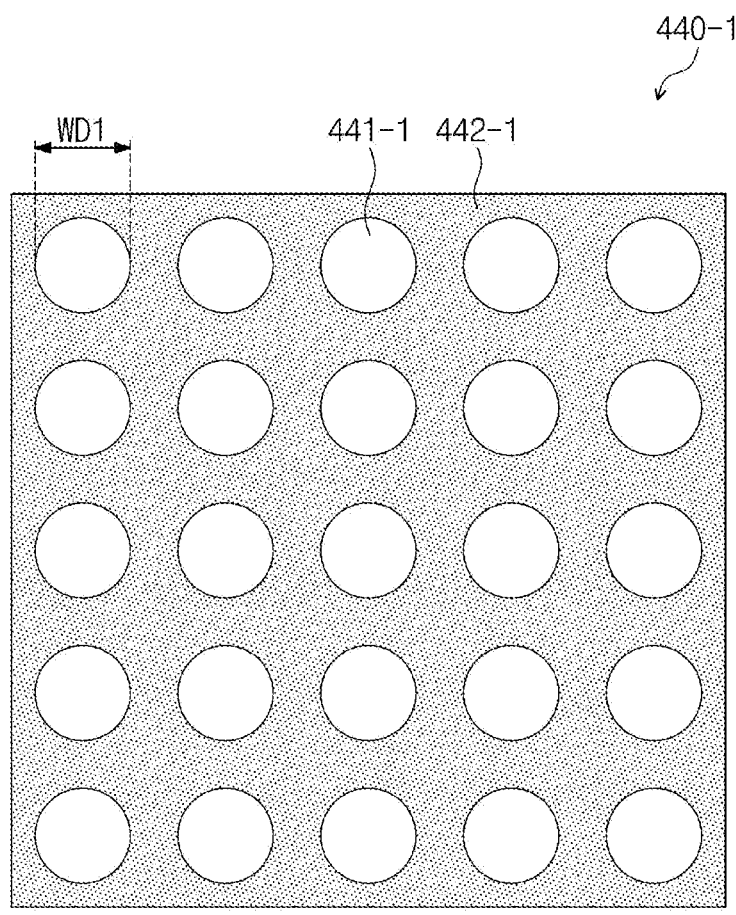
FIG. 7A is a plan view illustrating an optical pattern layer according to an embodiment of the present inventive concept.
Figure 7A:
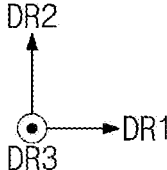

FIG. 7A is a plan view illustrating an optical pattern layer according to an embodiment of the present inventive concept.

Referring to FIGS. 5 and 7A, an optical pattern layer 440-1 may be designed in consideration of various factors such as the amount of light for sensing a fingerprint, resolution, and the size of the sensor 420-PD, on the basis of the field of view 2000-AG of the light 2000-L, the cross-talk, and/or the like.

The optical pattern layer 440-1 may include a plurality of transmission parts 441-1, and a shielding part 442-1 surrounding the plurality of transmission parts 441-1.

When seen on a plane, the plurality of transmission parts 441-1 may each have a circular shape. The plurality of transmission parts 441-1 may each have a first diameter WD1. However, this is an example, and the shapes of the plurality of transmission parts 441-1 according to an embodiment of the present inventive concept are not limited thereto. For example, the plurality of transmission parts 441-1 may be changed to various shapes such as an ellipse, a polygon, or the like.

The plurality of transmission parts 441-1 may be arranged along the first direction DR1 and the second direction DR2. For example, the plurality of transmission parts 441-1 may be arranged in a form of a matrix. However, this is an example, and the arrangement form of the plurality of transmission parts 441-1 according to an embodiment of the present inventive concept is not limited thereto. For example, the plurality of transmission parts 441-1 may be arranged in a form of a honeycomb arranged in a zigzag shape.

Figure 7B:
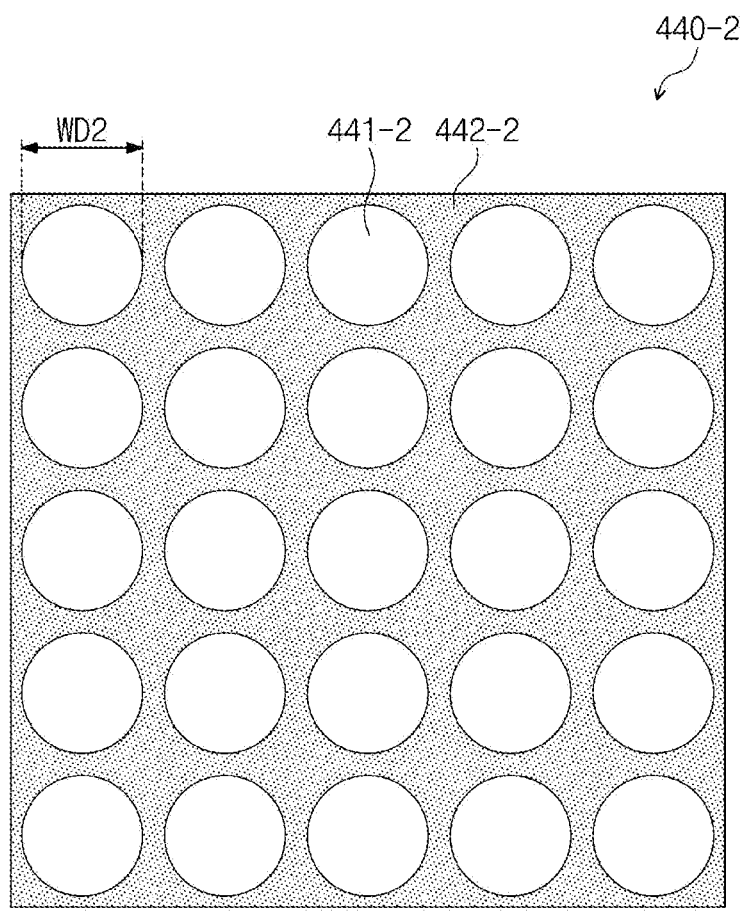
FIG. 7B is a plan view illustrating the optical pattern layer according to an embodiment of the present inventive concept.
Figure 7B:
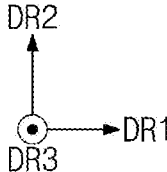

FIG. 7B is a plan view illustrating an optical pattern layer according to an embodiment of the present inventive concept.

Referring to FIGS. 5 and 7B, an optical pattern layer 440-2 may include a plurality of transmission parts 441-2 and a shielding part 442-2 surrounding the plurality of transmission parts 441-2.

When seen on a plane, the plurality of transmission parts 441-2 may each have a circular shape. The plurality of transmission parts 441-2 may each have a second diameter WD2. The second diameter WD2 may be greater than the first diameter WD1 (see FIG. 6A). The field of view 2000-AG of the light 2000-L may be controlled on the basis of the diameters of the plurality of transmission parts 441-2.

In an embodiment of the present inventive concept, the plurality of transmission parts 441-2 may have different diameters. For example, each of the transmission parts 441-2 may have either the first diameter WD1 or the second diameter WD2.

According to the present inventive concept, the optical pattern layer 440 and the light collecting layer 450 may be variously designed on the basis of the fill factor of the sensor 420-PD so as to increase a fingerprint recognition function. The field of view 2000-AG of the light 2000-L may be controlled on the basis of the diameters of the plurality of transmission parts 441-2. When the fill factor is about 10% to about 70%, the field of view 2000-AG of the light 2000-L may be about 15° to about 30°; and when the fill factor is greater than about 70% and equal to or less than 100%, the field of view 2000-AG of the light 2000-L may be about 1° to about 7°. A signal-to-noise ratio of the sensor 420-PD may be improved by designing as above. The fingerprint recognition accuracy of the sensing unit 400 may be increased. Accordingly, an electronic device 1000 (see FIG. 1) with increased fingerprint recognition reliability may be provided.

Figure 8A:
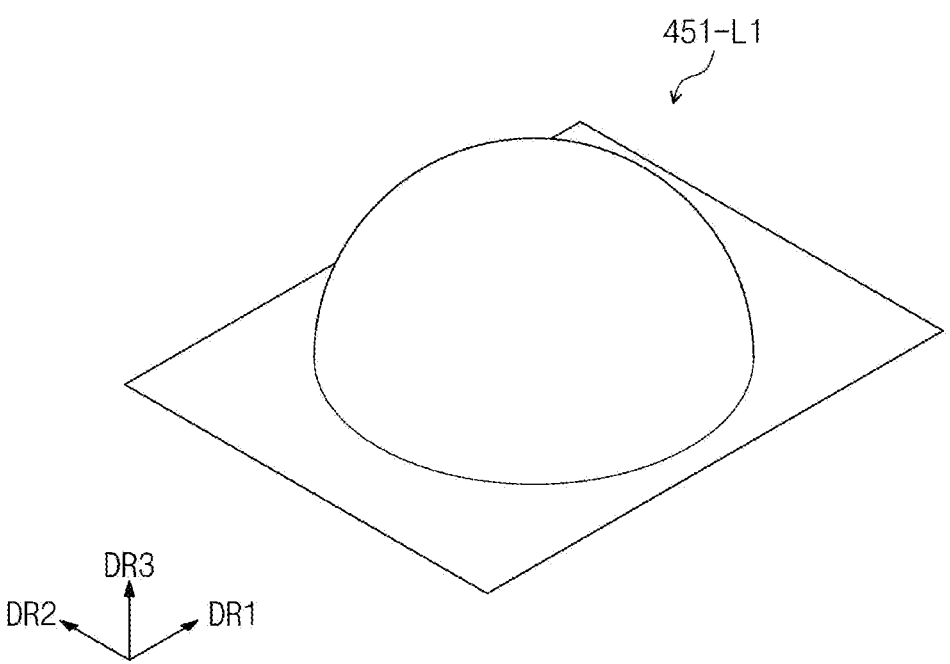
FIG. 8A is a perspective view illustrating one lens of a plurality of lenses according to an embodiment of the present inventive concept.

FIG. 8A is a perspective view illustrating one lens of a plurality of lenses according to an embodiment of the present inventive concept.

Referring to FIGS. 5 and 8A, a refractive layer 451 may include a lens array. The lens array may include a plurality of lenses 451-L. For example, one lens 451-L1 of the plurality of lenses 451-L may include a spherical lens. For example, the lens 451-L1 may include a spherical lens having a radius of about 17 μm. When seen on a plane, the lens 451-L1 may have a circular shape.

Figure 8B:
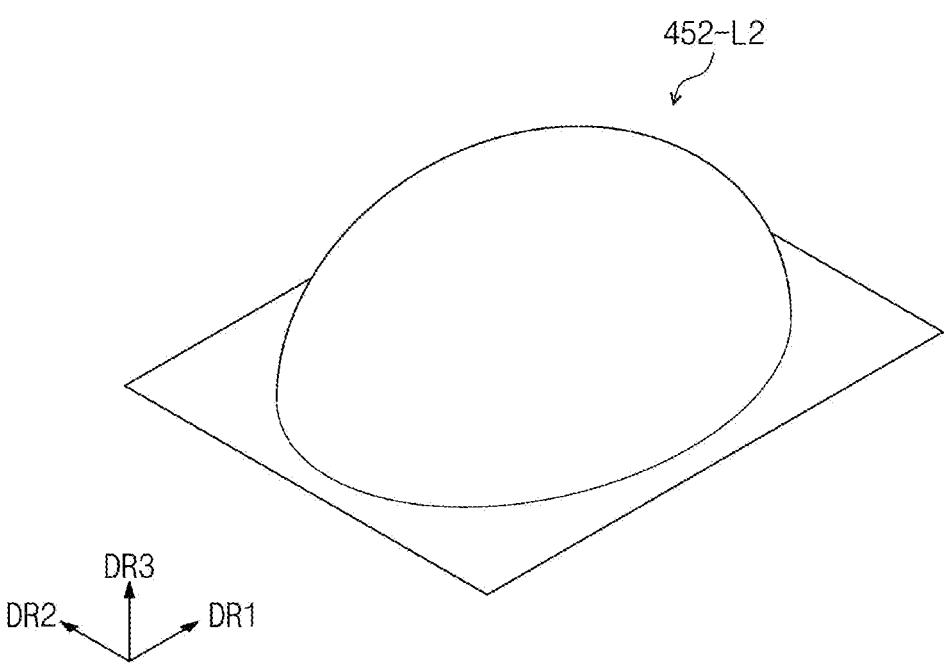
FIG. 8B is a perspective view illustrating one lens of the plurality of lenses according to an embodiment of the present inventive concept.

FIG. 8B is a perspective view illustrating one lens of a plurality of lenses according to an embodiment of the present inventive concept.

Referring to FIGS. 5 and 8B, a refractive layer 451 may include a lens array. The lens array may include a plurality of lenses 451-L. For example, one lens 451-L2 of the plurality of lenses 451-L may include an anamorphic lens. When seen on a plane, the lens 451-L2 may have an elliptical shape.

Figure 8C:
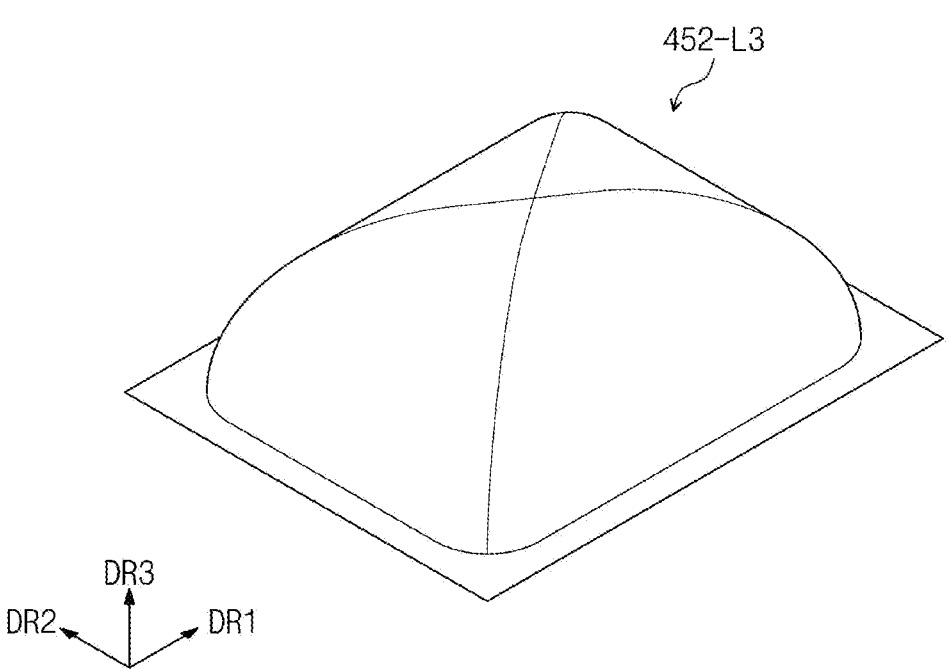
FIG. 8C is a perspective view illustrating one lens of the plurality of lenses according to an embodiment of the present inventive concept.

FIG. 8C is a perspective view illustrating one lens of a plurality of lenses according to an embodiment of the present inventive concept.

Referring to FIGS. 5 and 8C, a refractive layer 451 may include a lens array. The lens array may include a plurality of lenses 451-L. For example, one lens 451-L3 of the plurality of lenses 451-L may include a lens having four spherical surfaces. When seen on a plane, the lens 451-L3 may have a tetragonal shape.

According to the present inventive concept, the optical pattern layer 440 and the light collecting layer 450 may be variously designed on the basis of the biometric information sensing layer 420 so as to increase a fingerprint recognition function. The field of view 2000-AG of the light 2000-L may be controlled on the basis of the shape of each of the plurality of lenses 451-L. When the fill factor is about 10% to about 70%, the field of view 2000-AG of the light 2000-L may be about 15° to about 30°, and when the fill factor is greater than about 70% and equal to or less than 100%, the field of view 2000-AG of the light 2000-L may be about 1° to about 7°. The signal-to-noise ratio of the sensor 420-PD may be improved by designing as above. The fingerprint recognition accuracy of the sensing unit 400 may be increased. Accordingly, an electronic device 1000 (see FIG. 1) with increased fingerprint recognition reliability may be provided.

According to the description above, an optical pattern layer and a light collecting layer may be variously designed on the basis of a fill factor of a sensor to increase a fingerprint recognition function. When the fill factor is about 10% to about 70%, a field of view of light may be about 15° to about 30°, and a proportion of a cross-talk component of the sensor may be about 1% to about 10%. When the fill factor is greater than about 70% and equal to or less than 100%, a field of view of the light may be about 1° to about 7°, and the proportion of the cross-talk of the sensor may be about 1% to about 5%. A signal-to-noise ratio of the sensor may be improved by designing as above. The fingerprint recognition accuracy of a sensing unit may be increased.

Accordingly, an electronic device with increased fingerprint recognition reliability may be provided.

While the present inventive concept has been described with reference to embodiments thereof, it will be understood by those of ordinary skill in the art that various changes in form and details may be made thereto without departing from the spirit and scope of the present inventive concept.

What is claimed is:

1. An electronic device comprising:
a biometric information sensing layer including a sensor;
an optical pattern layer disposed on the biometric information sensing layer, and including a plurality of transmission parts and a light shielding part;
a display layer disposed on the optical pattern layer; and
a light collecting layer disposed between the display layer and the optical pattern layer,
wherein the sensor has a fill factor (FF), which is a ratio of an amount of light received by the sensor to a total amount of light incident onto the sensor, of about 10% to about 70%, and
the optical pattern layer and the light collecting layer are configured to provide a field of view (FOV) of light incident onto the sensor of about 15° to about 30°.

2. The electronic device of claim 1, wherein the optical pattern layer and the light collecting layer are further configured to provide a proportion of a cross-talk component of the sensor of about 1% to about 10%.

3. The electronic device of claim 1, wherein the light collecting layer comprises a refractive layer and a cover layer disposed on the refractive layer.

4. The electronic device of claim 3, wherein a first refractive index of the refractive layer is greater than a second refractive index of the cover layer.

5. The electronic device of claim 4, wherein the refractive layer comprises a lens array, and the cover layer comprises an infrared filter.

6. The electronic device of claim 1, wherein the plurality of transmission parts are arranged along a first direction and a second direction crossing the first direction, and the light shielding part surrounds the plurality of transmission parts.

7. The electronic device of claim 1, wherein the display layer comprises:
a base layer;
a circuit layer disposed on the base layer, and including a pixel circuit; and
a light-emitting element layer disposed on the circuit layer, and including a first electrode, a light-emitting layer, and a second electrode,
wherein the first electrode and the second electrode each comprise a transparent conductive material.

8. The electronic device of claim 1, wherein the display layer includes an active region and a peripheral region adjacent to the active region, wherein the active region displays an image, wherein the biometric information sensing layer includes a sensing region sensing biometric information, and
wherein the sensing region overlaps the active region.

9. The electronic device of claim 1, wherein at least one side of the sensor has a length of about 40 μm to about 60 μm.

10. An electronic device comprising:
a biometric information sensing layer including a sensor;
an optical pattern layer disposed on the biometric information sensing layer, and including a plurality of transmission parts and a light shielding part;
a refractive layer disposed on the optical pattern layer, and including a lens array;
a display layer disposed on the refractive layer; and
a light collecting layer disposed between the display layer and the optical pattern layer,
wherein the sensor has a fill factor (FF), which is a ratio of an amount of light received by the sensor to a total amount of light incident onto the sensor, of greater than about 70% and equal to or less than 100%, and
the optical pattern layer and the light collecting layer are configured to provide a field of view (FOV) of light incident onto the sensor of about 1° to about 7°.

11. The electronic device of claim 10, wherein the optical pattern layer and the light collecting layer are further configured to provide a proportion of a cross-talk component of the sensor of about 1% to about 5%.

12. The electronic device of claim 10, further comprising a cover layer disposed between the display layer and the refractive layer.

13. The electronic device of claim 12, wherein the cover layer comprises an infrared filter.

14. The electronic device of claim 10, wherein the display layer includes an active region and a peripheral region adjacent to the active region, wherein the active region displays an image, wherein the biometric information sensing layer includes a sensing region sensing biometric information, and
wherein the sensing region overlaps the active region.

15. The electronic device of claim 10, wherein the sensor has an area of about 40 μm×about 40 μm to about 60 μm×about 60 μm.

16. A display device comprising:
a biometric information sensing layer including a sensor;
an optical pattern layer disposed on the biometric information sensing layer, and including a plurality of transmission parts and a light shielding part;
a display layer disposed on the optical pattern layer; and
a light collecting layer disposed between the display layer and the optical pattern layer,
wherein the sensor has a fill factor, which is a ratio of an amount of light received by the sensor to a total amount of light incident onto the sensor, of about 70% to about 100%, and
the optical pattern layer and the light collecting layer are configured to provide a field of view of light incident onto the sensor of about 1° to about 7°.

17. The display device of claim 16, wherein the optical pattern layer and the light collecting layer are further configured to provide a proportion of a cross-talk component of the sensor of about 1% to about 5%.

* * * * *